United States Patent
Weiger Senften et al.

(10) Patent No.: US 8,633,696 B2
(45) Date of Patent: Jan. 21, 2014

(54) DESIGNING A TIME DEPENDENCY FOR A K-SPACE TRAJECTORY, IN PARTICULAR A SPIRAL

(75) Inventors: Markus Weiger Senften, Zurich (CH); Thomas Oberhammer, Wolhusen (CH); Franciszek Hennel, Karlsruhe (DE)

(73) Assignee: Bruker BioSpin MRI GmbH, Ettlingen (DE)

( * ) Notice: Subject to any disclaimer, the term of this patent is extended or adjusted under 35 U.S.C. 154(b) by 380 days.

(21) Appl. No.: 13/064,280

(22) Filed: Mar. 16, 2011

(65) Prior Publication Data
US 2011/0234227 A1    Sep. 29, 2011

(30) Foreign Application Priority Data
Mar. 24, 2010  (EP) ..................................... 10157581

(51) Int. Cl.
*G01R 33/48*     (2006.01)
(52) U.S. Cl.
USPC ........................... 324/309; 324/307; 600/410
(58) Field of Classification Search
USPC ................................... 324/300–322; 600/410
See application file for complete search history.

(56) References Cited

U.S. PATENT DOCUMENTS

| | | | |
|---|---|---|---|
| 6,566,877 B1 | 5/2003 | Anand | |
| 2009/0069664 A1* | 3/2009 | Kim et al. | 600/410 |

OTHER PUBLICATIONS

Simonetti O et al., "An Optimal Design Method for Magnetic Resonance Imaging Gradient Waveforms", IEEE Transactions on Medical Imaging, IEEE Service Center, Piscataway, NJ, vol. 12, No. 2, Jun. 1, 1993.

Jeffrey L Duerk et al., "Review of MRI Gradient Waveform Design Methods with Application in the Study of Motion", Concepts in Magnetic Resonance, NMR Concepts, Kingston, RI, vol. 5, Apr. 1, 1993.

Hargreaves B A et al., "Time-optimal Multidimensional Gradient Waveform Design for Rapid Imaging", Magnetic Resonance in Medicine, Academic Press, Duluth, MN, vol. 51, No. 1, Jan. 1, 2004.

Hardy C J et al., "Broadband Nuclear Magnetic Resonance Pulses with Two-Dimensional Spatial Selectivity", Journal of Applied Physics, American Institute of Physics. New York, US, vol. 66, No. 4, Aug. 15, 1989.

Cline H E et al., Design of a logarithmic k-space spiral trajectory, Magnetic Resonance in Medicine, Academic Press, Duluth, MN, vol. 46, No. 6, Jan. 1, 2001.

Glover G H, "Simple analytic spiral K-space algorithm", Magnetic Resonance in Medicine, Academic Press, Duluth, MN, vol. 42, No. 2, Jan. 1, 1999.

(Continued)

*Primary Examiner* — Melissa Koval
*Assistant Examiner* — Rishi Patel
(74) *Attorney, Agent, or Firm* — Paul Vincent

(57) ABSTRACT

A method for designing the time dependence function $k_m(t)$ for a given k-space trajectory $k_m$, where m stands for one or multiple of the spatial dimension indices x, y, or z, of a magnetic resonance imaging (=MRI) experiment carried out on an MRI system, wherein the trajectory $k_m$ is generated by applying a time varying waveform $g_m(t)$ of a gradient magnetic field, the method taking into account—the gradient magnitude limit G and—the gradient slew rate limit S of the MRI system, is characterized in that the method further takes into account a given frequency limit F in such a way that the gradient waveform $g_m(t)$ does not contain frequency components above the frequency limit F which is characteristic for the gradient hardware of the MRI system. The invention provides a method for designing a time dependence function for a given k-space trajectory, which allows obtaining better quality MRI images.

15 Claims, 6 Drawing Sheets

(56) References Cited

OTHER PUBLICATIONS

Heid et al., "Archimedian Spirals with Euclidean Gradient Limits", Magnetic Resonance in Medicine, Academic Press, Duluth, MN, vol. 3, Apr. 27, 1996.

Börnert P et al., "Improvements in spiral MR imaging", Magnetic Resonance Materials in Physics, Biology and Medicine, Chapman and Hall, London, GB, vol. 9, No. 1/2, Oct. 1, 1999.

King K F et al., "Optimized Gradient Waveforms for Spiral Scanning", Magnetic Resonance in Medicine, Academic Press, Duluth, MN, vol. 34, No. 2, Aug. 1, 1995, pp. 156-160.

Dwight G Nishimura et al., "A Velocity k-Space Analysis of Flow Effects in Echo-Planar and Spiral Imaging", Magn. Reson. Med. 33 (1995) 549.

August W Rihaczek et al. "Signal Energy Distribution in Time and Frequency", IEE Trans. Inform. Theory, 14 (1968) 369.

Boualem Boashash et al., "Estimating and Interpreting the Instantaneous Frequeny of a Signal—Part 1: Fundamentals", Proc. IEEE 80 (1992) 520.

\* cited by examiner f [kHz]

DESIGNING A TIME DEPENDENCY FOR A K-SPACE TRAJECTORY, IN PARTICULAR A SPIRAL

This application claims Paris Convention priority of EP 101 57 581.9 filed Mar. 24, 2010 the entire disclosure of which is hereby incorporated by reference

BACKGROUND OF THE INVENTION

The invention relates to a method for designing the time dependence function $k_m(t)$ for a given k-space trajectory $k_m$, where m stands for one or multiple of the spatial dimension indices x, y, or z, of a magnetic resonance imaging (=MRI) experiment carried out on an MRI system,
wherein the trajectory $k_m$ is generated by applying a time varying waveform $g_m(t)$ of a gradient magnetic field,
the method taking into account
 the gradient magnitude limit G and
 the gradient slew rate limit S
of the MRI system.

Such a method is known from H. E. Cline, Magn. Reson. Med. 4 (2001), 1130, see Ref. [5].

Magnetic resonance imaging (MRI) is a powerful, non-invasive tool for obtaining spatially resolved information of objects, in particular parts of a body of a living human or animal.

In order to obtain the spatially resolved information of the object, it is necessary to apply encoding procedures. Typically, frequency encoding and/or phase encoding procedures are applied by means of field gradients. The desired spatial resolution corresponds to an area in k-space in a reciprocal manner while the area of interest of the object corresponds to the distance of k-space points also in a reciprocal manner. Points in k-space are accessed by applying an appropriate strength and duration of a gradient magnetic field.

In many MRI experiments, the relevant area in k-space is scanned along the Cartesian coordinates. However, this procedure can be time consuming.

In order to accelerate the scanning of the relevant area in k-space, it is also known to scan along particular k-space trajectories, such as spiral type trajectories. With the k-space trajectory, a path in k-space is provided. However, in order to define which point of the trajectory shall be accessed at which point of time, a time dependence function has to be found for a given k-space trajectory. The time dependence function defines a time varying waveform of the gradient magnetic field which is to be applied during the MRI experiment.

When deriving a time dependence function for a given k-space trajectory, it is known to take into account a gradient magnitude limit G and a gradient slew rate limit S of the MRI system used, i.e. the time dependence function may not require too extreme waveform amplitudes and variations, compare [5]. The gradient magnitude limit takes into account that the gradient hardware may only provide a field strength of the gradient magnetic field of G at maximum. Further, the gradient slew rate limit S takes into account that the gradient hardware may only change the field strength of the magnetic field gradient per time of S at maximum.

However, even when taking into account the gradient magnitude limit G and the slew rate limit S when designing the time dependence function, artifacts have been found in resulting MRI images, in particular when the k-space trajectory is of spiral type.

It is therefore the object of the invention to provide a method for designing a time dependence function for a given k-space trajectory, which allows obtaining better quality MRI images.

SUMMARY OF THE INVENTION

This object is achieved, in accordance with the invention, by a method as introduced in the beginning, characterized in that the method further takes into account a given frequency limit F in such a way that the gradient waveform $g_m(t)$ does not contain frequency components above the frequency limit F which is characteristic for the gradient hardware of the MRI system.

The inventors found that the known limits G and S are not sufficient to adapt to the gradient hardware (gradient system) of the MRI system at which the MRI experiment is to be performed. Further to the limits G and S, the invention proposes to take into account a frequency limit F. The frequency limit F requires that the time dependence function is designed such that its resulting (target) gradient waveform $g_m(t)$ varies in a fashion only containing frequency components that may be generated with the given gradient hardware. Higher frequency components that may not be generated efficiently with the given gradient hardware are disallowed, i.e. the time dependence function is designed such that such higher frequency components do not occur in the resulting (target) gradient waveform. By this means, the design method takes into account the limited frequency response of the gradient hardware.

The frequency limit F is chosen with respect to the MRI system or its gradient hardware on which the MRI experiment is carried out. Typically, F is chosen such that all frequency components below the frequency limit F have a frequency response of the gradient hardware of at least 50%, preferably of at least 90%, and most preferably of at least 99%. Note that the frequency response of the gradient hardware, in general, is basically constant at 100% for low frequencies, then basically continuously decreases for intermediate frequencies, and finally is practically zero for high frequencies. According to the invention, F may be chosen such that F corresponds to the frequency at which the frequency response of the gradient hardware has dropped to a limit value LV of between 99% and 50%, preferably between 99% and 90%. Only above the frequency limit F, a significant damping occurs by means of the gradient hardware, but this is irrelevant for the MRI experiment then.

If the gradient waveform contained frequency components that may not be provided with the used MRI system or its gradient hardware, respectively, the true (experimentally realized, actual) k-space trajectory would deviate from the given (intended, target) k-space trajectory. In the latter case, artifacts would occur, or the image reconstruction would have to take into account the said deviations (i.e. the true k-space trajectory would have to be determined, and the image reconstruction would have to be based on the true points in k-space at which the measurements took place; note that some artifacts might still remain then). By means of the invention, the true k-space trajectory corresponds much more reliably and exactly to the given k-space trajectory. Artifacts are minimized, and image reconstruction is kept simple.

A k-space trajectory is a path through the one-, two-, or three-dimensional k-space, i.e. for a given trajectory, it is determined which locations should be passed and in which order this should happen, but not at which times. Hence, $k_m$ describes a series of vectors where the vector components represent the dimensions of the k-space. Often paths are parameterized using a length parameter l, hence the trajectory may be written as $k_m(l)$.

Taking into account a given limit means, in accordance with the invention, not to exceed this limit at any time of the scanning of the k-space trajectory. In particular, $g_m(t) \leq G$, $s_m(t) \leq S$, and $f_m(t) \leq F$ for all t, with t: time, $s_m(t)$: slew rate, and $f_m(t)$: instantaneous frequency with $$f_m(t) = \frac{1}{2\pi} \frac{d}{dt} \angle g_m(t).$$

Note that G, S and F may have different values for different coordinates of m.

In a preferred embodiment of the inventive method, the k-space trajectory $k_m$ is a spiral with phase angle $\phi(t)$, in particular a two-dimensional Archimedean spiral with a time-dependence:

$$k_x(t) = P\phi(t)\cos(\phi(t)),$$

$$k_y(t) = P\phi(t)\sin(\phi(t))$$

where P is a constant describing the spiral pitch. Spiral type trajectories have been found efficient for covering extended areas in k-space. Note that a spiral type trajectory typically starts or ends at $\vec{k}=0$.

In another preferred variant, the time dependence function $k_m(t)$ comprises three subsequent domains, wherein the time dependence function $k_m(t)$ within each domain is determined by one of said limits. Within a domain, the corresponding section of the time domain function $k_m(t)$ or its resulting waveform $g_m(t)$ is typically chosen such that it just stays within the respective limit (over the course of the complete domain), but at the same time optimizes another aspect, typically maximizes the scanning speed of the trajectory. Typically, during the course of a time dependence function, only one gradient hardware aspect is relevant at a time. This is reflected by the domains. The separation of the time dependence function in domains simplifies finding solutions, in particular analytical solutions, for the time dependence function, and finding the solutions is computationally more efficient than without domains (Note that domains are used also in other variants of the invention). In the present variant, there is a frequency limit domain, a slew rate limit domain and a gradient magnitude limit domain, what is typically enough for most trajectory types.

A preferred further development of the above two variants provides that the spiral starts at the k-space center, and has a sequence of a frequency limit domain, followed by a slew rate limit domain, followed by a gradient magnitude limit domain. Alternatively, in another further development, the spiral ends at the k-space center, and has a sequence of a gradient magnitude limit domain, followed by a slew rate limit domain, followed by a frequency limit domain. The sequence is described from start to end, in both above further developments. By the described further developments, the characteristics of most gradient hardware can be taken into account adequately.

An advantageous variant is characterized in that the k-space trajectory $k_m$ is an Archimedean spiral, and that in a frequency limit domain, the rotation angle $\phi(t)$ of the time dependence function $k_m(t)$ is given by $$\varphi_F(t) = \frac{(At)^2}{B + At}$$

with $A=2\pi F$, and the parameter B is chosen in a suitable way to obey the given frequency limit F. Note that the rotation angle information, together with the Archimedean spiral type condition, completely determines the time dependence function (here in the frequency limit domain). This variant provides a simple but useful parameterized approach for determining the time domain function in a frequency limit domain. B can be determined by deriving $g_m(t)$ from $\phi_F(t)$, further deriving $f_m(t)$ from $g_m(t)$, and demanding $f_m(t) \leq F$ for all m and for all t within the frequency domain (see also below). Note that the index at the rotation angle function $\phi(t)$ (here F) denotes the limit of the domain described.

In a preferred further development of this variant, $B \geq 3.35$. This value has been found appropriate for most applications.

A highly preferred variant is characterized in that in a frequency limit domain, the time dependence function $k_m(t)$ is determined including the following steps:
a) Choosing a time dependence function $k_m(t)$ of the k-space trajectory $k_m$ with at least one free parameter;
b) Determining a gradient function (waveform) as a function of time for the MRI system from the time dependence function according to $$g_m(t) = \frac{1}{\gamma} \frac{dk_m(t)}{dt}$$

with $\gamma$: gyromagnetic ratio;
c) Determining a complex gradient function by using the Hilbert transform H according to $$g_m^c(t) = g_m(t) + iH[g_m(t)]$$

d) Determining the instantaneous frequency function $f_m$ as a function of time t, with $$f_m(t) = \frac{1}{2\pi} \frac{d}{dt} \arg(g_m^c(t));$$

e) Determining the at least one free parameter of the time dependence function $k_m(t)$ by demanding $f_m(t) \leq F$ for all m in the complete frequency limit domain. This variant provides a universal and simple way to determine the time dependence function in a section dominated by the frequency limit.

Further preferred is a variant characterized in that the trajectory $k_m$ is a two-dimensional spiral trajectory with dimensions x and y,
that in a frequency limit domain, the time dependence function $k_m(t)$ is determined including the following steps:
a) Choosing a time dependence function $k_m(t)$ of the k-space trajectory $k_m$ with at least one free parameter;
b) Determining a gradient function as a function of time for the MRI system from the time dependence function $k_m(t)$ according to $$g_x(t) = \frac{1}{\gamma} \frac{dk_x(t)}{dt} \text{ and } g_y(t) = \frac{1}{\gamma} \frac{dk_y(t)}{dt}$$

with $\gamma$: gyromagnetic ratio;
c) Determining a complex gradient function according to $$g^c(t) = g_x(t) + ig_y(t);$$

d) Determining the instantaneous frequency function $f_m$ as a function of time t, with $$f_m(t) = \frac{1}{2\pi} \frac{d}{dt} \arg(g^c(t))$$

e) Determining the at least one free parameter of the time dependence function $k_m(t)$ by demanding $f_m(t) \leq F$ for all m in the complete frequency limit domain. This variant provides a simple way to determine the time dependence function in a section dominated by the frequency limit in case of a two dimensional spiral type trajectory.

In a preferred further development of the above two variants, after execution of step e) it is further demanded that $$\tilde{F} \leq F - \frac{1}{d_F}$$

where $d_F$ is the duration of the frequency-limited domain, and step e) is repeated with the newly calculated $\tilde{F}$. In repeated step e), $\tilde{F}$ is used instead of F. With this variant, a spectral broadening associated with the limited duration of the frequency limited domain can be taken into account, so the reliability of the method can be increased.

Preferably, in the above further development, the said further demand is achieved in an iterative procedure. This is required when the demanded condition is not fulfilled after a first repetition of step e). Hence, with an always newly calculated $\tilde{F}$ step e) is repeated until the demanded condition is fulfilled.

In another advantageous variant of the inventive method, the time dependence function $k_m(t)$ contains two subsequent domains, wherein the time dependence function $k_m(t)$ within one domain is determined by the gradient magnitude limit, and within the other domain is determined by the slew rate limit, with the time dependence function $k_m(t)$ in the slew rate limit domain being selected so as to fulfill also the frequency limit. In this way, the design method can be kept simple; the time domain function can do with just two domains, making its description clearly laid out. Note that in the slew rate limit domain, the slew rate associated with the time domain function and its resulting waveform $g_m(t)$ typically may have to be significantly below the slew rate limit for some time during the course of the domain. However, the basic type of the time domain function or the resulting waveform in the slew rate limit domain will be oriented at the slew rate limit, and typically one or several parameters in the approach are chosen or limited in order to make sure that the frequency limit is also obeyed to.

In a further development of this variant, with a spiral type trajectory, the spiral starts at the k-space center, and has a sequence of the slew rate limit domain, with the time dependence function $k_m(t)$ in the slew rate limit domain being selected so as to fulfill also the frequency limit, followed by the gradient magnitude limit domain. Alternatively, the spiral ends at the k-space center, and has a sequence of the gradient magnitude limit domain followed by the slew rate limit domain, with the time dependence function $k_m(t)$ in the slew rate limit domain being selected so as to fulfill also the frequency limit. These sequences have been found useful for most gradient hardware.

In another advantageous further development of the above variant, the time dependence function $k_m(t)$ in the slew rate limit domain is designed (as in Ref. [5]) according to the formula $$\varphi_S(t) = \beta t^2 \left(2 + 2\left(\frac{2\beta}{3}\right)^{1/6} t^{1/3} + \left(\frac{2\beta}{3}\right)^{2/3} t^{4/3}\right)^{-1}$$

in which the parameter $\beta$ is set at maximum to the lower value of
either $$\beta = \frac{\gamma SD}{M}$$

where $\gamma$ is the gyromagnetic ratio, D the field-of-view, and M the number of spiral interleaves,
or $\beta_F = (7.825 \, F)^2$. Note again that the rotation angle $\phi(t)$ together with the spiral type correlation completely determines the time dependence function. By making sure that a $\beta$ of at maximum $\beta_F$ is used in the approach for $\phi(t)$ in the slew rate domain (see index S), also the frequency limit F is obeyed to in this domain.

Finally, in an advantageous variant of the inventive method, in order to fulfill all limits in all domains, the time dependence function and the transition points between the domains are determined while fulfilling the following conditions either by analytical or iterative calculation:

a) A limitation is fulfilled throughout its associated domain;
b) In all previous domains the associated value increases monotonously;
c) At all previous transition points the associated value stays equal or increases when changing to the next domain;
d) In all following domains the associated value decreases monotonously;
e) At all following transition points the associated value stays equal or decreases when changing to the next domain. The time dependence function here comprises several domains, with the time dependence function having different descriptions in these domains ("sections"). Each domain has one value associated with its respective limit, typically the gradient magnitude $g_m$ with respect to G, the slew rate $s_m$ with respect to S, or the independent frequency $f_m$ with respect to F. When the above conditions are met, a value will be automatically uncritical (below its limit) outside its domain, and may therefore be "ignored" there in the further procedure. This simplifies the design of the time dependence function.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is shown in the drawing.

DESCRIPTION OF THE PREFERRED EMBODIMENT

Figure 1A:
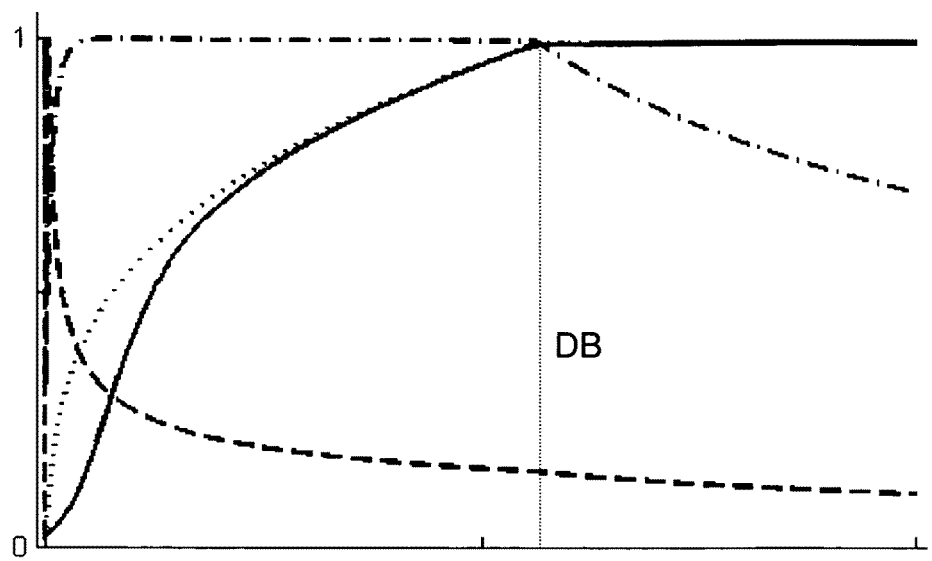
FIG. 1a-1c show diagrams of parameters |g| target, |g| actual, |s| target, and f target of differently designed time domain functions or their corresponding gradient waveforms, respectively, as a function of time for a k-space trajectory of Archimedean spiral type,
   with a time dependence function comprising a slew rate limit domain and a gradient magnitude limit domain, designed according to Cline [5] in FIG. 1a,
   with a time dependence function comprising a slew rate limit domain and a gradient magnitude limit domain, wherein the slew rate limit domain is adapted also to take into account a frequency limit F, in accordance with the invention, in FIG. 1b, with a time dependence function comprising a frequency limit domain, a slew rate limit domain, and a gradient magnitude limit domain, in accordance with the invention, in FIG. 1c.
Figure 1B:
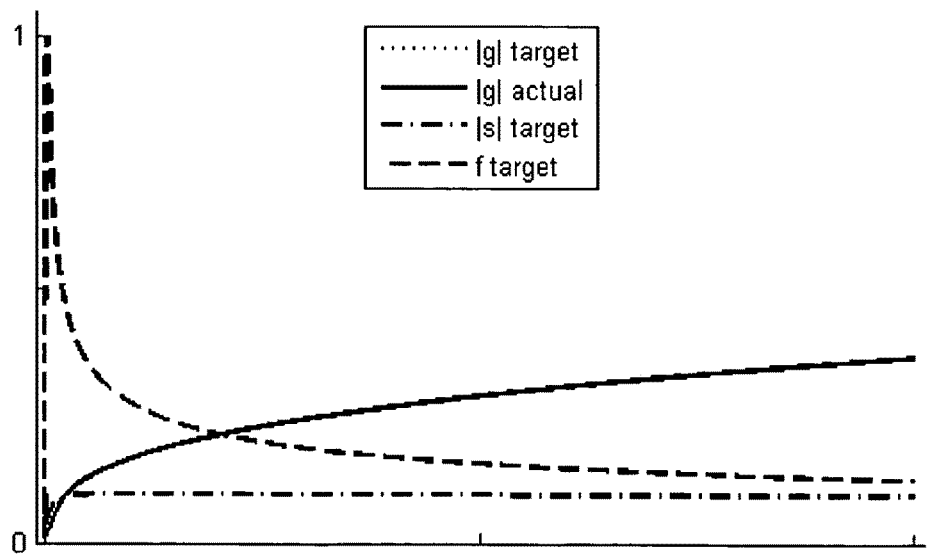
Figure 1C:
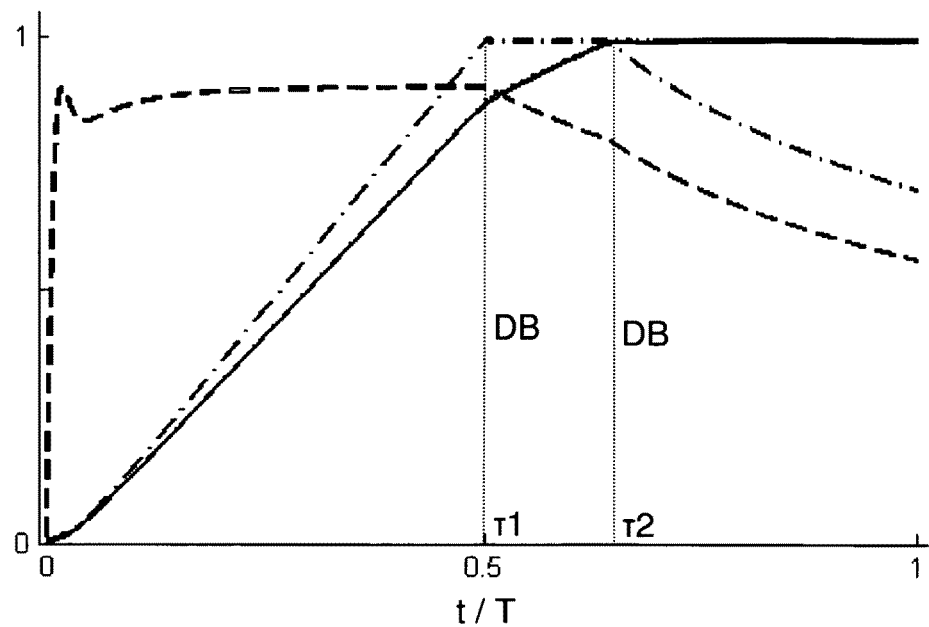

Spiral k-space trajectories are used in MRI (magnetic resonance imaging) due to their high efficiency in exploiting the gradient capacities and their low sensitivity to flow [1]. For a given k-space trajectory, e.g. an Archimedean spiral, its time dependence can be parameterized in various ways.

The general approach for calculating the optimal parameterization is a constrained minimization with the spiral duration as the target criterion and the limitations of the gradient system forming the constraints. For a practical implementation of a spiral design a computationally efficient calculation of the parameterization is required while taking into account the limitations of the gradient system, namely maximum amplitude G and slew rate S. For this purpose, King proposed to split the parameterization into two domains, the first one constrained by S and the second one by G [2]. Approximate solutions of the associated differential equations were presented by Heid [3], compare $\phi_S(t)$ and $\phi_G(t)$ in equation block (3) below, and subsequently improved by Glover [4] and Cline [5], compare equation block (1) below for the Cline design.

Importantly, within a given domain it is not only made sure that the respective limitation is respected, but the design of $\phi(t)$ also takes into account that the gradient system is actually used at its limits to a large degree. In doing so, the duration of the trajectory will be minimized. Furthermore it is important that the limitation of the neighboring domain is also respected. This again is realized by appropriately designing the parameterization and choosing the transition point between the domains.

However, despite including the restrictions for G and S, the actually realized spiral trajectory can deviate from the expected one. This happens if the gradient waveform contains frequencies beyond the bandwidth limit of the gradient system, which is determined by the characteristics of the gradient amplifier, the self-inductance of the gradient coil, and eddy currents induced in materials surrounding the gradient coil.

Currently, there are two approaches to handle this problem. The first one consists of shifting the frequency limit to higher values by adjusting the gradient preemphasis and, due to a limited amplitude margin available for the pre-emphasis, can be successful only to a certain degree. In the second approach, the actual trajectory is measured and used in the reconstruction. However, the actual trajectory may not sufficiently fulfill the basic requirements for a proper reconstruction, i.e. the covered area and density in k-space, leading to reduced resolution and/or image artifacts due to aliasing. Furthermore, distorted trajectories can complicate or even inhibit proper density correction in k-space as required by non-Cartesian trajectories.

Therefore, in the present invention, the frequency limit of the gradient system is introduced as an additional constraint for gradient waveform design, leading to an improved fidelity of k-space trajectories, in particular spiral trajectories.

TABLE 1

Equations / equation blocks (1) through (4)

$$\varphi_S(t) = \beta t^2 \left( 2 + 2\left(\frac{2\beta}{3}\right)^{1/6} t^{1/3} + \left(\frac{2\beta}{3}\right)^{2/3} t^{4/3} \right)^{-1} \quad (1)$$

$$\varphi_G(t) = \sqrt{\varphi_\tau^2 + 2\kappa(t - t_\tau)}, \; \beta = \frac{\gamma SD}{M}, \; \kappa = \frac{\gamma GD}{M}$$

$$f(t) = \frac{1}{2\pi} \frac{d}{dt} \angle g(t), \; g(t) = g_x(t) + i g_y(t) \quad (2)$$

$$\varphi_F(t) = \frac{(At)^2}{B + At}, \; A = 2\pi F, \; B = 3.35 \quad (3)$$

$$\varphi_S(t) = \left( \varphi_{\tau 1}^{3/2} + \frac{3}{2}\sqrt{\beta}(t - t_{\tau 1}) \right)^{2/3}$$

$$\varphi_G(t) = \sqrt{\varphi_{\tau 2}^2 + 2\kappa(t - t_{\tau 2})}$$

$$\frac{\tilde{A}}{2\pi} + \frac{1}{d_F} \leq F \quad (4)$$

Theory

In the following, the invention is discussed by way of example with respect to a k+ space trajectory of Archimedean spiral type.

The coordinates of a two-dimensional general spiral trajectory are $$k_x(\phi) = r(\phi)\cos(\phi + \phi_0)$$

$$k_y(\phi) = r(\phi)\sin(\phi + \phi_0) \quad (5)$$

where the rotation angle $\phi = \phi(t)$ is the parameterization and $\phi_0$ is an angle offset often used as an individual parameter for different interleaves in a multi-shot spiral. The related gradient values (waveform values) are $$g_x(t) = \frac{1}{\gamma} \frac{dk_x}{dt} \quad (6)$$

$$g_y(t) = \frac{1}{\gamma} \frac{dk_y}{dt}$$

For the Archimedean spiral $$r(\phi) = P\phi \quad (7)$$

where P is a constant describing the spiral pitch.

Equation block (1) summarizes the parameterization of the Archimedean spiral by Cline [5] given as a continuous rotation angle $\phi(t)$ with gyromagnetic ratio $\gamma$, field-of-view D, number of interleaves M, and transition point r between slew rate- and amplitude-limited domains. As a time-resolved measure of the frequency of a gradient waveform, the instantaneous frequency f [6, 7] can be employed, given by the time-derivative of the angle of the complex gradient amplitude g(t) according to equation (2).

The instantaneous frequency f is used to limit the frequencies of a gradient waveform to a maximum value F. The frequency limit F can be used in the Cline design as an additional limitation in the slew rate-limited domain where the largest frequencies occur. In order not to exceed F, an additional upper limit for β of $\beta_F=(7.825\ F)^2$ can be used. However, although with this approach the gradient system is used within its limits, the gradient system is not used efficiently, as neither slew rate nor frequency will be driven close to their limiting values during a large fraction in this domain. In short, lowering β reduces the slew rate which can result in a greatly increased spiral duration T.

Therefore, a three-domain parameterization is proposed with an initial frequency-limited domain, followed by two domains adapted from the Heid solutions [3], compare equation block (3) including a rotation angle function $\phi_F(t)$ for the frequency limit domain. Generally, the frequency-limited domain is designed to overall use the maximum frequency, but at t=0 it should fulfill G=0 and k=0, and in particular close to t=0, F must not be exceeded. The value of B in the modified constant angular velocity spiral $\phi_F$ was found by numerical optimization implying calculation of the trajectory, the gradients, and the instantaneous frequency f according to equations/equation blocks (7), (5), (6), and (2). The free parameter(s) are then chosen to obey the given frequency limitation.

For a complete description of the time dependence function, the transition points τ1 between frequency-limited and slew rate-limited domain as well as τ2 between slew rate-limited and amplitude-limited domain in equation block (3) must be determined. Depending on the parameters, it can happen that there is no slew rate-limited domain and the frequency-limited domain is directly followed by the amplitude-limited domain. Furthermore, there may be no amplitude-limited domain, or no slew rate-limited domain and no amplitude-limited domain. Generally, it is required that all limitations are fulfilled in all domains. This is guaranteed if the following conditions are fulfilled: a) The limitation is fulfilled throughout its associated domain; b) In all previous' domains the associated value increases monotonously; c) At all previous' transition points the associated value stays equal or increases when changing to the next domain; d) In all following domains the associated value decreases monotonously; e) At all following transition points the associated value stays equal or decreases when changing to the next domain. Ideally, these conditions are fulfilled in an analytical calculation of the transition points. However, the analytical solution is sometimes difficult to obtain, hence the calculation can be replaced by an iterative procedure. Furthermore, often the associated values of the limitations can be expressed by time derivatives of the time dependence functions. E.g. in case of a spiral trajectory, it holds that $g=g(\phi,\dot\phi)$, $s=s(\phi,\dot\phi,\ddot\phi)$, $f=f(\phi,\dot\phi)$. Hence, instead of directly fulfilling the conditions for the associated values, also the respective time derivatives of the time dependence functions can be used.

To actually restrict the frequency to the given limit F, also the duration $d_F$ of the first domain (the frequency limited domain) should be taken into account, as this duration also influences the spectral width of the frequencies of the applied gradient shapes. Therefore, an additional condition is introduced, compare equation (4), that is fulfilled in an iterative procedure. In order to fulfill this condition, after calculation of the duration $d_F$ of the frequency-limited domain, a new value Ã is calculated that fulfills Eqn. (4) and the previous calculations are repeated by using this value for A. The iterations are repeated until Eqn. (4) is fulfilled for the current value of A. This procedure shifts the spectrum to lower frequencies by half the spectral width.

Methods

Simulations were based on a Fourier analysis of the gradient waveforms. Synthetic k-space data was generated by discrete FT (Fourier transformation) of an object (phantom), and images were reconstructed using standard gridding. Real data was acquired on a Bruker BioSpec at 7 T and reconstructed using measured trajectories.

Results

FIGS. 1a through 4c show simulation results for three different designs of time dependence functions using G=40 mT/m, S=600 T/m/s, and D=10 cm. A single-shot protocol with matrix size 32 was chosen as the investigated effects are most prominent at the spiral start.

Figure 2A:
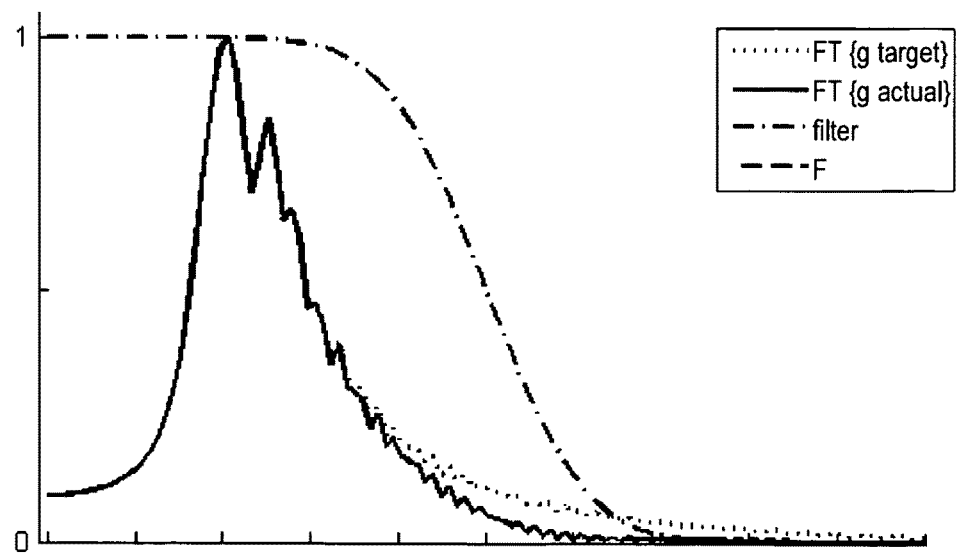
FIG. 2a-2c show diagrams of the Fourier transforms of g target and g actual of FIGS. 1a-1c.
Figure 2B:
Figure 2C:
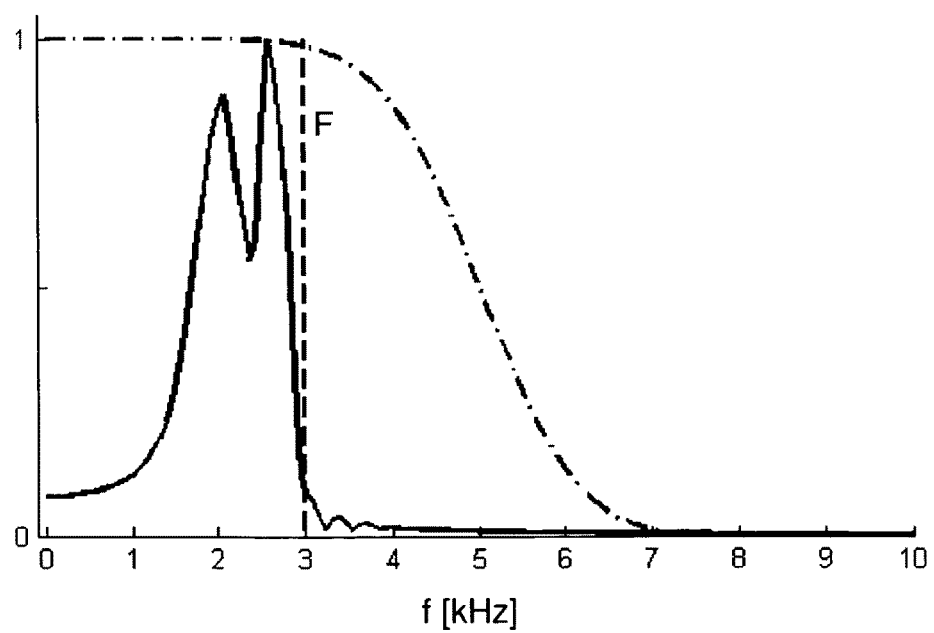
Figure 3A:
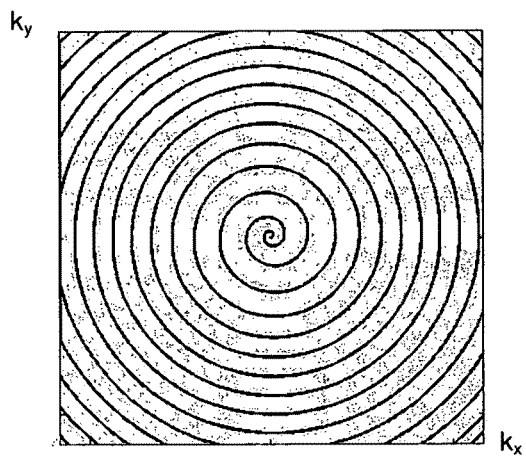
FIG. 3a-3c shows diagrams of the actual k-space trajectories for the time dependence functions of FIGS. 1a-1c.
Figure 3B:
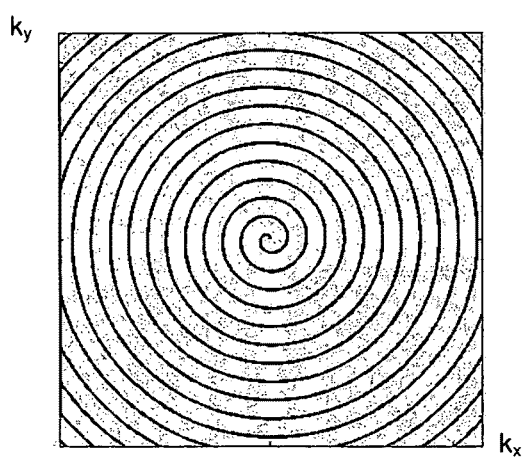
Figure 3C:
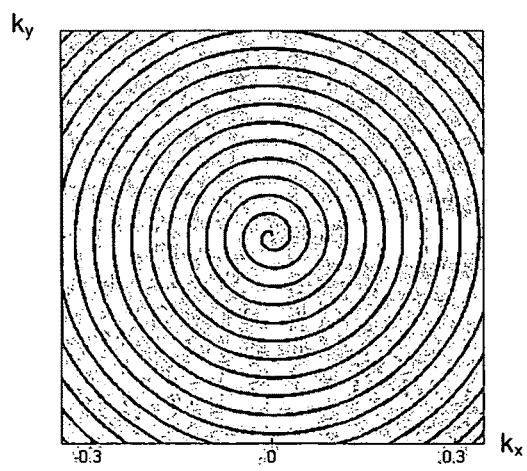
Figure 4A:
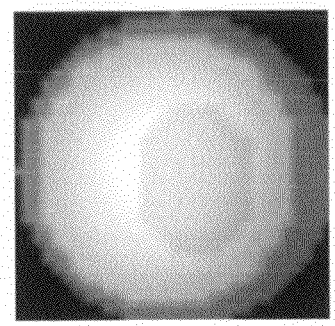
FIG. 4a-4c shows reconstructed, simulated images of a phantom, based on the time dependence functions of FIGS. 1a-1c, and taking into account g actual.
Figure 4B:
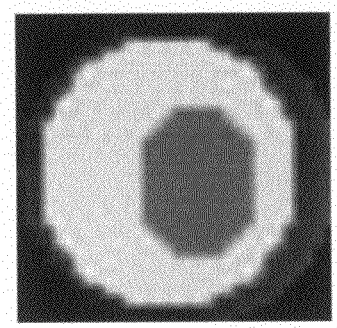
Figure 4C:
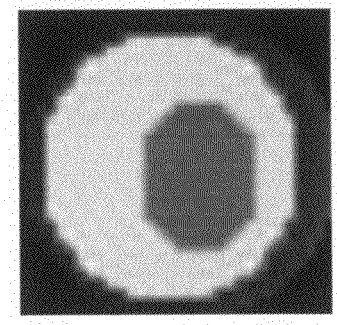

The performance of different designs of the time dependence of the Archimedean spiral trajectory has been compared for a model gradient system whose frequency response corresponds to a low-pass filter with a 50% amplitude attenuation at 5 kHz (dash-dotted line in FIGS. 2a-2c).

The original Cline design without frequency limitation (FIG. 1a) exhibits the two domains (first slew rate limit domain, second gradient magnitude limit domain, compare the domain border DB) wherein the gradient and slew rate amplitudes (|g| and |s|) are normalized to their limits (G and S), while the maximum frequency f of 16 kHz is scaled to 1. The Fourier analysis (FIG. 2a) shows that this design generates high frequencies which are damped by the gradient system. Due to the damping the actual gradient is reduced (see FIG. 1a, with |g| actual below |g| target), the trajectory has a reduced density in the center (see FIG. 3a), and the reconstructed image is corrupted (see FIG. 4a).

In the second design (see FIG. 1b), which is based on Cline but applies a $\beta_F=(7.825\ F)^2$, with F=5 kHz, the instantaneous frequency f (plotted normalized with F) is effectively constrained within the F-limit, which can also be observed in the Fourier analysis (see FIG. 2b) (Note that F here corresponds to a drop of the frequency response of the gradient system/hardware, here referred to as "filter", to 50%). Only a negligible gradient damping occurs, resulting in an improved trajectory (see FIG. 3b) and a clean image (see FIG. 4b). However, the reduced slew rate leads to a considerably increased total gradient waveform duration T. Note that as the gradient maximum G is never reached in the first domain, so no gradient amplitude limited domain exists in this particular situation.

In the 3-domain design (see FIG. 1c, with first a frequency limit domain, then a slew rate limit domain, and finally a gradient magnitude limit domain, compare the domain borders DB), F was set to 3 kHz corresponding to the end of the plateau of the filter function (The filter function represents the frequency response of the gradient system/hardware; and the frequency limit F is chosen here at the frequency at which the frequency response has dropped to about 98%). The three domains can be noticed in the design plot (FIG. 1c) with the frequency running close to the limit throughout the first domain and decreasing afterwards. Correspondingly, the intensity drops at the limit F in the spectrum, see FIG. 2c. The trajectory (see FIG. 3c) is realized as desired, providing the same image quality (see FIG. 4c) as before (in FIG. 4b) at an only moderately increased T compared to the original Cline design.

Figure 5A:
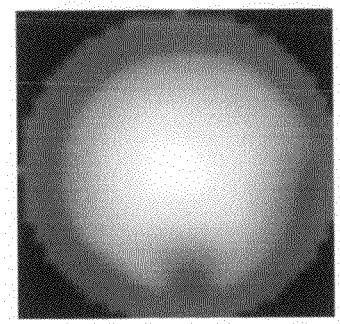
FIG. 5a-5c shows experimental images of a phantom, measured with time domain functions similar to those of FIG. 1a-1c, without applying a frequency limit F in FIG. 5a, with a frequency limit F of 15 kHz in a two domain design in FIG. 5b, and with a frequency limit F of 10 kHz in a three domain design in FIG. 5c.
Figure 5B:
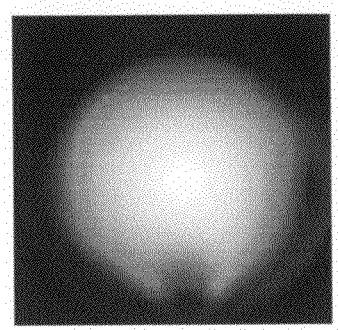
Figure 5C:
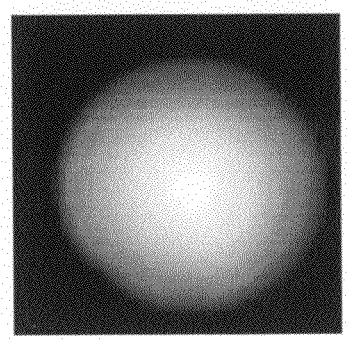

With the same set of designs, experiments were performed with G=134 mT/m, S=6130 T/m/s, and D=7 cm, resulting in T=2.2 ms (F=∞), 5.8 ms (F=15 kHz), and 2.6 ms (F=10 kHz), compare FIG. 5a-5c. Without frequency limitation, similar artifacts as in the simulation occur (see FIG. 5a), which are removed for the improved designs (FIGS. 5b, 5c). The advantage of the shorter acquisition with the 3-domain design becomes obvious by the absence of the off-resonance blurring due to a field distortion close to the imaged slice.

CONCLUSION

An improved, 3-domain design for Archimedean spiral trajectories has been proposed, utilizing the instantaneous frequency for taking into account frequency limitations of the gradient system. The new layout enables creating trajectories with high fidelity and efficiency, leading to improved spiral image quality.

REFERENCES

[1] Nishimura D G, Magn. Reson. Med. 33 (1995) 549.
[2] King K F, Magn. Reson. Med. 34 (1995) 156.
[3] Heid O, Proc. ISMRM Conference 1996, 114.
[4] Glover G H, Magn. Reson. Med. 42 (1999) 412.
[5] Cline H E, Magn. Reson. Med. 4 (2001) 1130.
[6] Rihaczek A W, IEEE Trans. Inform. Theory, 14 (1968) 369.
[7] Boashash B, Proc. IEEE 80 (1992) 520.

We claim:

1. A method for designing a time dependent function $k_m(t)$ for a given k-space trajectory $k_m$, where m stands for one or multiple spatial dimension indices x, y, or z, of a magnetic resonance imaging=MRI experiment carried out on an MRI system, the method comprising the steps of:
   a) determining a gradient magnitude limit G;
   b) determining a gradient slew rate limit S;
   c) determining a frequency limit F, the frequency limit being characteristic for gradient hardware of the MRI system and denoting a maximum frequency that can reliably be produced by the gradient hardware; and
   d) generating the trajectory $k_m$ by applying a time varying waveform $g_m(t)$ of a gradient magnetic field while obeying the gradient magnitude limit, the gradient slew rate limit, and the gradient hardware frequency limit, wherein no instantaneous frequency of the gradient waveform $g_m(t)$ transgresses the frequency limit F, the k-space trajectory $k_m$ being a spiral with a rotation angle $\phi(t)$, wherein the time dependent function $k_m(t)$ comprises the following three domains:
      a frequency limit domain, in which the instantaneous frequency is close to the frequency limit while the gradient slew rate and gradient amplitude remain below the gradient slew rate and gradient amplitude limits;
      a slew rate limit domain, in which the gradient slew rate is close to the gradient slew rate limit while the instantaneous frequency and gradient amplitude remain below the frequency and gradient magnitude limits; and
      an amplitude limit domain, in which the gradient amplitude is close to the gradient amplitude limit while the instantaneous frequency and gradient slew rate remain below the frequency and slew rate limits.

2. The method of claim 1, wherein the spiral starts at a k-space center, and has a sequence of the frequency limit domain, followed by the slew rate limit domain, followed by the gradient magnitude limit domain.

3. The method of claim 1, wherein the spiral ends at a k-space center, and has a sequence of the gradient magnitude limit domain, followed by the slew rate limit domain, followed by the frequency limit domain.

4. The method of claim 1, wherein the k-space trajectory $k_m$ is a two-dimensional Archimedean spiral with a time-dependence:

$$k_x(t) = P\phi(t)\cos(\phi(t)),$$

$$k_y(t) = P\phi(t)\sin(\phi(t))$$

where P is a constant describing the spiral pitch, and in the frequency limit domain, the rotation angle $\phi(t)$ of the time dependence function $k_m(t)$ is given by $$\varphi_F(t) = \frac{(At)^2}{B + At}$$

with $A = 2\pi F$, the parameter B being chosen in a suitable way to obey the given frequency limit F.

5. The method of claim 4, wherein $B \geq 3.35$.

6. The method of claim 1, wherein the time dependent function $k_m(t)$ comprises a frequency limit domain in which the instantaneous frequency is close to the frequency limit while the gradient slew rate and gradient amplitude remain below the gradient slew rate and gradient amplitude limit, determination of the time dependence function $k_m(t)$ in the frequency limit domain comprising the steps of:
   e) choosing the time dependent function $k_m(t)$ of the k-space trajectory $k_m$ with at least one free parameter;
   f) determining the gradient waveform $g_m(t)$ as a function of time for the MRI system from the time dependent function according to $$g_m(t) = \frac{1}{\gamma} \frac{dk_m(t)}{dt}$$

with $\gamma$: gyromagnetic ratio;
   g) determining a complex gradient waveform by using a Hilbert transform H according to $$g_m^c(t) = g_m(t) + iH[g_m(t)];$$

h) determining an instantaneous frequency function $f_m$ as a function of time t, with $$f_m(t) = \frac{1}{2\pi} \frac{d}{dt} \arg(g_m^c(t));$$

and
   i) determining the at least one free parameter of the time dependence function $k_m(t)$ by demanding $f_m(t) \leq F$ for all m in a complete frequency limit domain.

7. The method of claim 1, wherein the trajectory $k_m$ is a two-dimensional spiral trajectory with dimensions x and y and, in the frequency limit domain, the time dependence function $k_m(t)$ is determined including the following steps:
   e') choosing a time dependence function $k_m(t)$ of the k-space trajectory $k_m$ with at least one free parameter;
   f') determining a gradient waveform as a function of time for the MRI system from the time dependent function $k_m(t)$ according to $$g_x(t) = \frac{1}{\gamma} \frac{dk_x(t)}{dt} \text{ and } g_y(t) = \frac{1}{\gamma} \frac{dk_y(t)}{dt}$$

with $\gamma$: gyromagnetic ratio;
   g') determining a complex gradient waveform according to $$g^c(t) = g_x(t) + ig_y(t);$$

h') determining the instantaneous frequency function $f_m$ as a function of time t, with $$f_m(t) = \frac{1}{2\pi}\frac{d}{dt}\arg(g^c(t));$$

and i') determining the at least one free parameter of the time dependence function $k_m(t)$ by demanding $f_m(t) \leq F$ for all m in the complete frequency limit domain.

8. The method of claim 6, wherein, after execution of step i), it is further demanded that $$\tilde{F} \leq F - \frac{1}{d_F}$$

where $d_F$ is the duration of the frequency-limited domain, and step e) is repeated with the newly calculated $\tilde{F}$.

9. The method of claim 7, wherein, after execution of step i'), it is further demanded that $$\tilde{F} \leq F - \frac{1}{d_F}$$

where $d_F$ is the duration of the frequency-limited domain, and step e) is repeated with the newly calculated $\tilde{F}$.

10. The method of claim 8, wherein the further demand is achieved in an iterative procedure.

11. The method of claim 9, wherein the further demand is achieved in an iterative procedure.

12. The method of claim 1, wherein the time dependent function $k_m(t)$ contains a gradient magnitude limit domain and a slew rate limit domain, the time dependent function $k_m(t)$ within the gradient magnitude limit domain being determined by the gradient magnitude limit, and the time dependent function $k_m(t)$ within the slew rate limit domain being determined by the slew rate limit, wherein the time dependent function $k_m(t)$ in the slew rate limit domain is selected so as to also fulfill the frequency limit.

13. The method of claim 12, wherein the k-space trajectory $k_m$ is a spiral with a rotation angle $\phi(t)$, the spiral starting at a k-space center and having a sequence of the slew rate limit domain, with the time dependence function $k_m(t)$ in the slew rate limit domain being selected so as to also fulfill the frequency limit, followed by the gradient magnitude limit domain.

14. The method of claim 12, wherein the k-space trajectory $k_m$ is a spiral with a rotation angle $\phi(t)$, the spiral ending at a k-space center and having a sequence of the gradient magnitude limit domain followed by the slew rate limit domain, with the time dependence function $k_m(t)$ in the slew rate limit domain being selected so as to also fulfill the frequency limit.

15. The method of claim 13, wherein the time dependent function $k_m(t)$ in the slew rate limit domain is designed according to the formula $$\varphi_S(t) = \beta t^2 \left(2 + 2\left(\frac{2\beta}{3}\right)^{1/6} t^{1/3} + \left(\frac{2\beta}{3}\right)^{2/3} t^{4/3}\right)^{-1}$$

in which the parameter $\beta$ is set at maximum to the lower value of
either $$\beta = \frac{\gamma SD}{M}$$

where $\gamma$ is the gyromagnetic ratio, D the field-of-view, and M the number of spiral interleaves,
or $\beta_F = (7.825\, F)^2$.

* * * * *